United States Patent
Patterson

(10) Patent No.: US 7,602,218 B2
(45) Date of Patent: Oct. 13, 2009

(54) THERMAL ELECTRIC NAND GATE

(75) Inventor: Joseph Martin Patterson, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 12/270,781

(22) Filed: Nov. 13, 2008

(65) Prior Publication Data

US 2009/0206883 A1 Aug. 20, 2009

Related U.S. Application Data

(63) Continuation-in-part of application No. 12/120,109, filed on May 13, 2008, which is a continuation-in-part of application No. 12/040,765, filed on Feb. 29, 2008, now Pat. No. 7,564,267, which is a continuation-in-part of application No. 12/032,549, filed on Feb. 15, 2008.

(51) Int. Cl.
*H03K 19/20* (2006.01)
(52) U.S. Cl. .............................. 326/104; 326/7; 326/136
(58) Field of Classification Search ...................... 326/1, 326/7, 104, 136
See application file for complete search history.

(56) References Cited

U.S. PATENT DOCUMENTS 3,461,272 A * 8/1969 Hirsbrunner ................. 219/505
3,548,293 A * 12/1970 Hirsbrunner ................. 323/352

* cited by examiner

*Primary Examiner*—Anh Q Tran
(74) *Attorney, Agent, or Firm*—Law office of Gerald Maliszewski; Gerald Maliszewski

(57) ABSTRACT

A thermal electric (TE) binary NAND gate logic circuit is provided with a method for NAND logic gating. The method accepts a first input voltage representing an input binary logic state and generates a first thermal electric (TE) temperature in response to the first input voltage. A second input voltage is accepted representing an input binary logic state, and a second TE temperature is generated in response to the second input voltage. In response to the first and second TE temperatures, a NAND logic state output voltage is generated. More explicitly, a first control voltage is generated in response to the first TE temperature, and a second control voltage is generated in response to the second TE temperature. Then, a third TE temperature is generated in response to the first and second control voltages, which in turn generates the output voltage.

15 Claims, 11 Drawing Sheets

US 7,602,218 B2

THERMAL ELECTRIC NAND GATE

RELATED APPLICATIONS

This application is a Continuation-in-part of a pending patent application entitled, THERMAL ELECTRIC NOR GATE, invented by Joseph Patterson, Ser. No. 12/120,109, filed May 13, 2008;

which is a Continuation-in-part of a patent application entitled, THERMAL ELECTRIC LOGIC CIRCUIT, invented by Joseph Patterson, Ser. No. 12/040,765, filed Feb. 29, 2008 now U.S. Pat. No. 7,564,267;

which is a Continuation-in-part of a pending patent application entitled, SOLID STATE THERMAL ELECTRIC LOGIC, invented by Joseph Patterson, Ser. No. 12/032,549, filed Feb. 15, 2008. All of the above-mentioned applications are incorporated herein by reference.

BACKGROUND OF THE INVENTION

1. Field of the Invention

This invention generally relates to binary logic circuitry and, more particularly, to a solid state NAND gate logic device made from thermal electric components instead of semiconductor transistors.

2. Description of the Related Art

Three-element (cathode/grid/plate) triode tubes and transistors are widely understood electronic devices used for signal processing and logic operations. It is obvious the transistors are a cornerstone of modern technology. However, designers are beginning to bump against physical limitations associated with transistors which impede circuit size and performance. For example, transistor device sizes are limited by the thickness of the gate insulation that can be formed. However, thin oxide layers are sensitive to contamination and break down voltages. More generally, transistors are subject to failure when exposed to electromagnetic pulses (EMP), cosmic rays, electrostatic discharge (ESD), and Alpha particle radiation. Further, many of the processes associated with conventional complementary metal oxide semiconductor (CMOS) integrated circuits (ICs) are complicated, use high process temperatures, involve the use of poisonous materials, and expensive fabrication equipment.

It would be advantageous if a NAND gate logic device could be made with a technology other than solid state semiconductor transistors.

SUMMARY OF THE INVENTION

A solid state NAND gate logic device is presented that requires no active semiconductor diodes, transistors, or vacuum tubes, and which can be configured into basic circuit blocks performing logic functions. The solid state NAND gate device can be fabricated without expensive semiconductor processing, is insensitive to contamination, and operates with a wide range of supply voltages, from volts down to the tens of millivolt range. The device is highly insensitive to EMP, cosmic rays, ESD, and Alpha particles. Because only lower temperature "back end" processing steps are utilized, multiple active layers and connective layers can be stacked vertically on the same substrate for 3D construction, permitting high density circuits to be fabricated. Since fewer steps are involved, fewer types of chemicals are used, and a lower volume of chemicals are required. Also, because of the lower temperatures, less energy is consumed in the manufacturing.

Thermal electrical (TE) elements are used for sensing input voltages (input logic signals), creating a temperature responsive to the input voltage, and generating an output voltage responsive to temperature. Thermocouples and thermopiles are examples of some conventional TE elements.

Accordingly, a method is provided for thermal electric binary NAND logic gating in a logic device. The method accepts a first input voltage representing an input binary logic state and generates a first thermal electric (TE) temperature in response to the first input voltage. A second input voltage is accepted representing an input binary logic state, and a second TE temperature is generated in response to the second input voltage. In response to the first and second TE temperatures, a NAND logic state output voltage is generated, which may be stored in a tangible memory medium.

More explicitly, a first control voltage is generated in response to the first TE temperature, and a second control voltage is generated in response to the second TE temperature. Then, a third TE temperature is generated in response to the first and second control voltages, which in turn generates the output voltage.

To generate the first TE temperature, a first TE element is connected to the first input voltage and a current source/sink having an intermediate voltage, approximately midway between an input logic high voltage and an input logic low voltage. Likewise, the second TE temperature is generated by providing a second TE element connected to the second input voltage and a current source/sink having the intermediate voltage.

To generate the first control voltage, a fourth TE is thermally connected to the first TE, electrically connected to a first voltage reference, and electrically connected to an output to supply the first control voltage. Likewise, a fifth TE is thermally connected to the second TE, electrically connected to the first voltage reference, and electrically connected to an output to supply the second control voltage.

A third TE is electrically connected to the first and second control voltages to generate the third TE temperature. A sixth TE is thermally connected to the third TE, electrically connected to a first (~logic high) reference voltage, and electrically connected to supply the output voltage.

Additional details of the above-described method and a thermal electric NAND logic device are provided below.

DETAILED DESCRIPTION

Figure 1A:
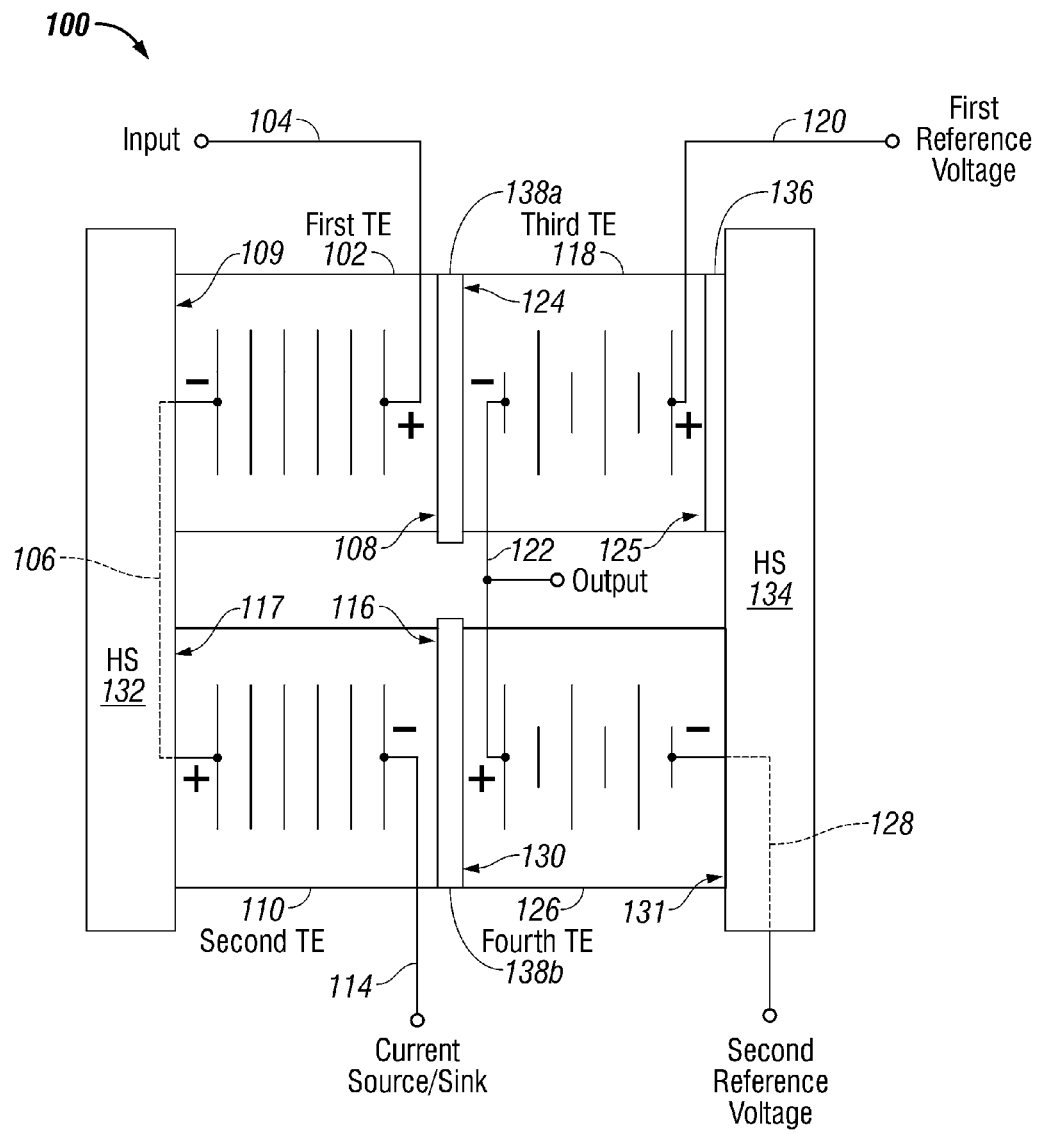
FIGS. 1A and 1B are schematic block diagrams of thermal electric binary logic circuits.
Figure 1B:
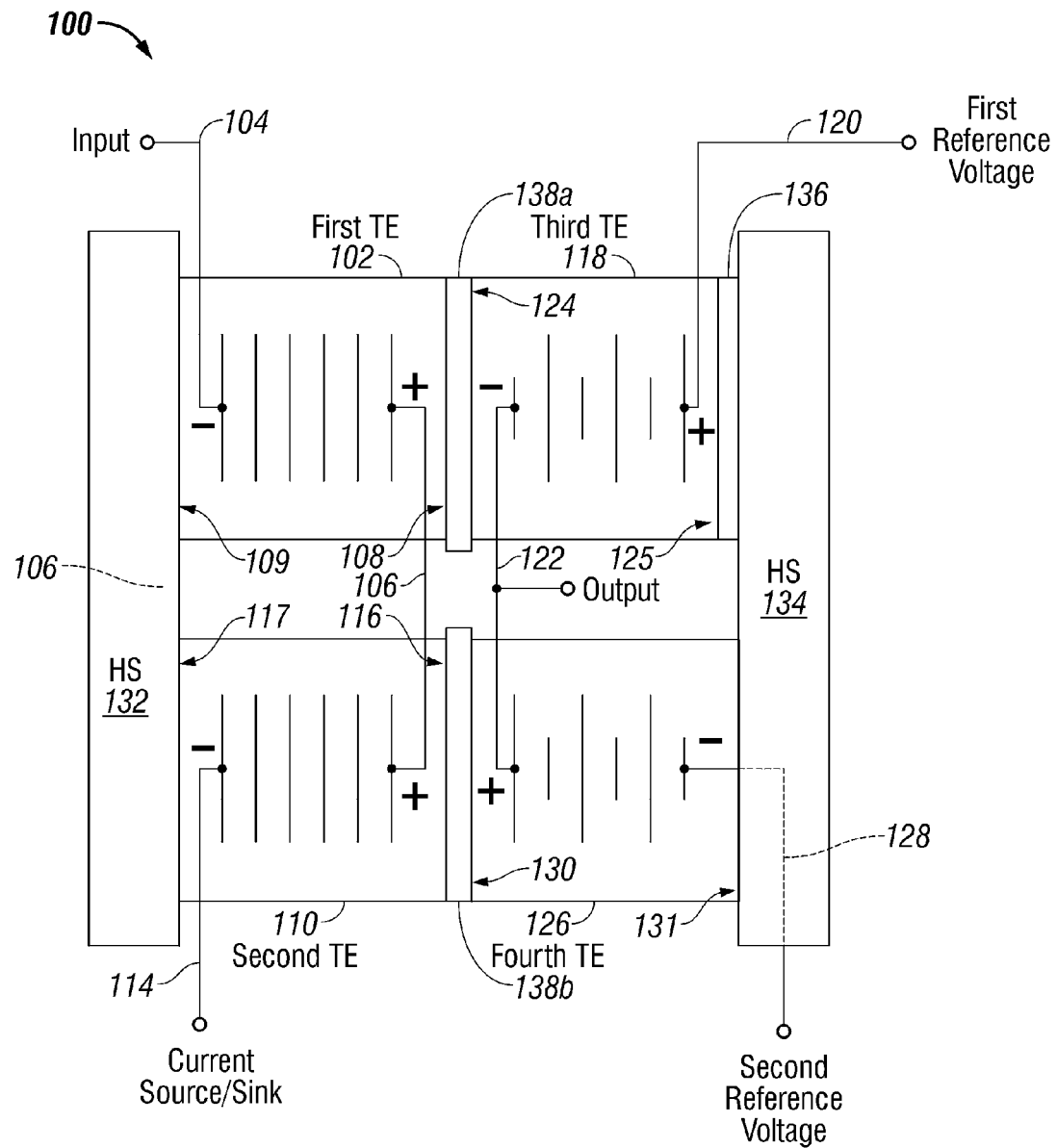

FIGS. 1A and 1B are schematic block diagrams of thermal electric binary logic circuits. FIG. 1A is an inverter and FIG. 1B is a non-inverter. The logic circuit 100 comprises a first thermal electric (TE) element 102 having a first electrical interface connected on line 104 to accept an input voltage representing an input logic state and a second electrical interface connected on line 106. The first TE element 102 has a thermal interface 108 to supply a first temperature responsive to the input voltage on line 104 and a second thermal interface 109. A second TE element 110 has a first electrical interface, electrically connected to the first TE second electrical interface on line 106, and a second electrical interface connected with line 114 to a current source/sink. The current source/sink reference on line 114 has an intermediate voltage, approximately midway between an input logic high voltage and an input logic low voltage. The second TE element 110 has a thermal interface 116 to supply a second temperature responsive to the input voltage and a thermal interface 117.

As explained in more detail below, the TE electrical interfaces are typically connected to opposite ends of a thermocouple or thermal pile. Lines in the TE elements are intended to represent a stack of alternating materials, which is how most thermocouples are manufactured. In some aspects, it is assumed for simplicity that thermal and electrical interfaces are a common interface, or that the electrical connections are made to the TE through the thermal interfaces. As explained in more detail below, a TE element is defined as an element that relies upon the Peltier effect to convert current into temperature, and a series of thermocouples (a thermopile) exhibiting the Seebeck effect, which is the result of two Peltier electromotive forces (emfs) and two Thomson emfs.

When the input voltage is high (logic high), current flows from the input on line 104 to the current sink on line 114. As a result, in FIG. 1A, the thermal interface 108 increases in temperature and thermal interface 116 decreases in temperature. When the input voltage is low (logic low), current flows from the current source on line 114 to the input on line 104. As a result, thermal interface 116 increases in temperature and thermal interface 108 decreases in temperature. In FIG. 1B, when the input voltage is high (logic high), the thermal interface 108 decreases in temperature and thermal interface 116 increases in temperature. When the input voltage is low (logic low), current flows from the current source on line 114 to the input on line 104. As a result, thermal interface 116 decreases in temperature and thermal interface 108 increases in temperature.

A third TE element 118 has a first electrical interface connected on line 120 to a first reference voltage and a second electrical interface connected on line 122 to supply an output voltage. The third TE element 118 has a thermal interface 124 thermally connected to the first TE element thermal interface 108 and a thermal interface 125 thermally connected to heatsink 134. A fourth TE element 126 has a first electrical interface connected on line 122 to the third TE element second electrical interface, and a second electrical interface connected on line 128 to a second reference voltage. The fourth TE element 126 has a thermal interface 130 thermally connected to the second TE element thermal interface 116 and a thermal interface 131 thermally connected to heatsink 134.

A first heatsink (HS) 132 is thermally connected to the first TE element thermal interface 109 and to the second TE element thermal interface 117. In the aspect shown, the first HS 132 is electrically conductive, so that the electrical connection on line 106 (shown as a dotted line) is made through the HS in FIG. 1B. Alternately but not shown, the first and second TE elements may be electrically isolated from HS 132, and electrical connection represented by line 106 in FIG. 1B is made independent of the heatsink. In another aspect, the heatsink is not electrically conductive.

A second heatsink 134 is thermally connected to the third TE element thermal interface 125 to the fourth TE element thermal interface 131. In the aspect shown, the second HS 134 is electrically conductive, so that the electrical connection on line 128 (shown as a dotted line) is made through the HS. To isolate the first and second voltages, a thermally conductive electrical insulator 136 may be interposed between HS 134 and the third TE element first electrical interface connected on line 120. A thermally conductive electrical insulator 138a is interposed between the first TE element 102 and the third TE element 118. Likewise, a separate insulator 138b is interposed between the second TE element 110 and the fourth TE element 126.

In the aspect shown in FIG. 1A, the first TE element first electrical interface connected on line 104 and thermal interface 108 are substantially the same interface. That is, line 104 is connected in close proximity to thermal interface 108. In some aspects, it is assumed for simplicity that thermal and electrical interfaces are a common interface, or that the electrical connections are made to the TE through the thermal interfaces. Alternately stated, a thermal interface may act as an electrical interface. The close proximity of interfaces permits changes in temperature resulting from TE current flow to be more directly sensed at the proximate thermal interface. Also in FIG. 1A, the second TE element second electrical interface connected on line 114 and thermal interface 116 are substantially the same interface. Assuming that the first voltage reference has a higher potential than the second voltage reference, then the third TE element second electrical interface connected on line 122 supplies a logic signal inverted from the input signal. The above-described circuits are examples of a quad-TE inverter or non-inverter circuits. Additional examples of quad-TE circuits can be found in parent application Ser. No. 12/040,765 (see FIGS. 1-3).

Figure 10:
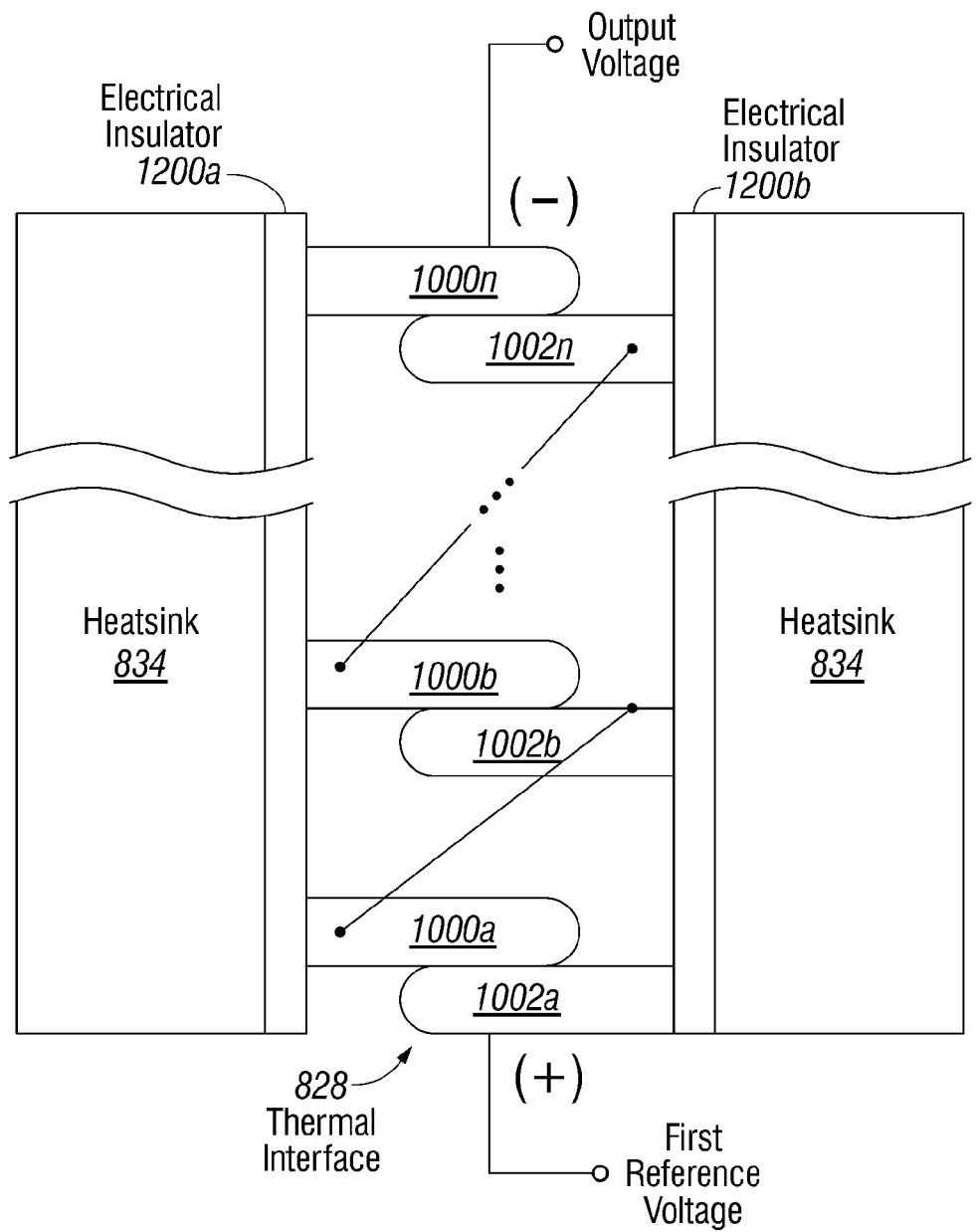
FIG. 10 is a schematic block diagram depicting the sixth TE of the TE logic module of FIG. 9 in greater detail.

In one aspect, the third TE and the fourth TE have positive and negative polarities. For example, the third TE 118 may have its positive polarity end on line 120, assuming that the first reference voltage has a higher potential than the second reference voltage. With reference to the polarity TE of FIG. 10, the third TE would have element 1002a (the positive polarity end of the TE) connected to the first reference voltage on line 120. The fourth TE 126 has its negative polarity end connected to line 128. Referencing FIG. 12, element 1002a would be connected to line 128. Alternately, if the polarity TE of FIG. 10 is used as the fourth TE 126, element 1002a would be connected to the second reference voltage on line 128. For simplicity, TE elements having a polarity have been represented as composed of alternating long and short lines. For consistency in this disclosure, the positive polarity end of the TEs is shown associated with a long line. In contrast, the first and second TEs 102 and 110 are shown without polarities. While the voltage-to-heat conversion function may benefit from the use of a polarity TE, their use is not critical. The elements drawn with uniform length lines are intended to represent TEs with a polarity assigned in response to initially defining a particular function.

The performance of thermal electric devices is based upon two effects: the Peltier effect and the Thomson effect. The Peltier effect defines the results when a single junction, made from two different materials, is joined and a current is sent through the junction while the thermal electric device ends are maintained at constant temperature. Under these conditions a heat flow takes place between the junction and it surroundings. The amount of Peltier heat transferred at any junction is proportional to the current through the junction and that the transfer reverses direction when the direction of the current is reversed. Such a junction is a source within which electrical energy is converted to heat, or heat is converted to electrical energy. The Peltier emf developed across a junction made from materials "a" and "b" is defined as the heat absorbed or liberated per unit quantity of electricity crossing the junction. Mathematically, $P_{emf}$=Peltier Heat/Charge transfer.

The Thomson effect describes the behavior of a wire made from a single material with an electrical current passed down its length and the ends of the wire are at different temperatures. Under these conditions, the density of free elections varies from point-to-point along the wire length, and heat is absorbed or liberated at all points down the wire. The "Thomson Heat" is proportional to the quantity of electricity passing through a section of wire and to the temperature difference between the ends of the section. The Thomson Heat is also reversible and depends on the nature of the wire and the average temperature of the section of the wire.

A thermal couple (thermocouple) consists of two wires of different materials that form two junctions. Thus, a thermal couple is made of two Peltier junctions and two wires exhibiting the Thomson effect. A thermal couple emf is the combination of these two effects. A thermopile is a device consisting of many thermal couples connected in series. The total emf of the thermopile is the sum of all the individual thermal couples.

The fundamental principle behind the behavior of all of these devices is the Seebeck Effect and is attributed to the fact that the density of free electrons is different for different materials, and within the same material, the density of free electrons is different at different temperatures.

The difference in free electron density results in a difference in force. The greater the free electron density, the greater is the force. The nature of the force is the electrostatic charge of the electron. Since the force is cumulative, more electrons per unit area or volume means that the force is greater. For different materials forming a junction, the greater the difference in free electron density, the greater the emf. The emf is a thermal emf and called a Seebeck emf, after Thomas Johann Seebeck.

In an attempt to correct the imbalance of force at the junction, a current is enabled (charge transfer across the junction). The principles of physics state that a system always moves in a direction to lower its energy state. In this case, the system is a section of wire or a junction of two materials. A hotter section of wire is at a higher energy state and the electrons in the hotter section of wire are in a higher energy state. Thermal energy is the Kinetic energy (energy of motion) of the material including the electrons. Electrons can carry thermal energy and move from a higher energy state to a lower energy state. In other words, the electrons move from a hotter portion of the wire to a colder portion, carrying the heat away with them. Thus, TE elements act to bring into balance unequal forces due to the difference in free electron density resulting from temperature (or material differences in the case of a junction).

The above-mentioned principles are also at work in the operation of a semiconductor junction. The built-in potential of a semiconductor junction is a result of the difference in charge density of the two materials on the opposite sides of the junction. The charge density on the N-type side (free electron density due to impurity doping), and the different charge density and polarity of the holes on the P-type side (again due to impurity doping) results in an imbalance in electrostatic forces at the junction. In an attempt to correct the imbalance, charge is transferred across the junction and a built-in electric field results. This built-in field is measured externally as the forward diode drop of the semiconductor junction. It is also a thermal emf and changes with temperature.

However, a Peltier heater/cooler can be distinguished from a semiconductor junction. For example, a bismuth-telluride TE is a bulk piece of BiTe doped with Antimony to make it N-type, with another bulk piece of BiTe doped to make it P-type. The two separate pieces are attached together, usually with solder, to form the completed TE element. There is no diode junction and it is not rectifying. The semiconductor material enhances the Peltier effect just as bismuth has the most favorable thermal electric effect properties for a pure metal.

Although a thermocouple can be distinguished from a semiconductor junction (transistor type junction), it is technically possible for a semiconductor junction to be used as a TE element, as it can be used to convert current to temperature, and temperature to voltage, without the conventional transistor action that produces an inverted signal.

The TE elements described in FIGS. 1A and 1B may be enabled as thermocouples, or thermopiles made from alternating layers of bismuth and nickel, or bismuth and copper. Bismuth has the highest thermal electric properties of any metal. The stack of layers may be interdigitated metals. Thermocouples can also be made from tellurium, which when doped, is a semiconductor. In one aspect, bismuth-telluride layer may be stacked between a metal such as copper. Alternately, the TE elements may be a stack of layers made from a single material. The logic circuitry of FIGS. 1A and 1B are not limited to any particular thermocouple design or materials.

Table 1 lists constants associated with the emf of a nickel and bismuth thermopile of 1 layer, 10 layers, and 25 layers, at different temperatures, where:

$emf=(a1-a2)t+\frac{1}{2}(b1-b2)t^2$, where t=temperature (C);

a1 and b1 are constants associated with nickel; and, a2 and b2 are constants associated with bismuth.

TABLE 1

| a1 | b1 | a2 | b2 | temperature C. | Emf In millivolts one layer | Emf In millivolts ten layers | Emf In millivolts 25 layers | metals |
|---|---|---|---|---|---|---|---|---|
| 19.1 | −43.7 | −0.03 | −0.47 | 25 | 0.93 | 9.23 | 23.06 | nickel and bismuth |
| 19.1 | −43.7 | −0.03 | −0.47 | 100 | 5.34 | 53.4 | 133.5 | nickel and bismuth |
| 19.1 | −43.7 | −0.03 | −0.47 | 125 | 7.36 | 73.63 | 184.06 | nickel and bismuth |
| 19.1 | −43.7 | −0.03 | −0.47 | 0 | 0 | 0 | 0 | nickel and bismuth |
| 19.1 | −43.7 | −0.03 | −0.47 | 5 | 0.16 | 1.63 | 4.06 | nickel and bismuth |
| 19.1 | −43.7 | −0.03 | −0.47 | 10 | 0.34 | 3.36 | 8.4 | nickel and bismuth |
| 19.1 | −43.7 | −0.03 | −0.47 | 15 | 0.52 | 5.21 | 13.01 | nickel and bismuth |
| 19.1 | −43.7 | −0.03 | −0.47 | 20 | 0.72 | 7.16 | 17.9 | nickel and bismuth |
| 19.1 | −43.7 | −0.03 | −0.47 | 25 | 0.92 | 9.23 | 23.06 | nickel and bismuth |
| 19.1 | −43.7 | −0.03 | −0.47 | 30 | 1.14 | 11.4 | 28.5 | nickel and bismuth |
| 19.1 | −43.7 | −0.03 | −0.47 | 35 | 1.37 | 13.69 | 34.21 | nickel and bismuth |
| 19.1 | −43.7 | −0.03 | −0.47 | 40 | 1.61 | 16.08 | 40.2 | nickel and bismuth |
| 19.1 | −43.7 | −0.03 | −0.47 | 45 | 1.86 | 18.59 | 46.46 | nickel and bismuth |
| 19.1 | −43.7 | −0.03 | −0.47 | 50 | 2.12 | 21.2 | 53 | nickel and bismuth |
| 19.1 | −43.7 | −0.03 | −0.47 | 55 | 2.39 | 23.93 | 59.81 | nickel and bismuth |
| 19.1 | −43.7 | −0.03 | −0.47 | 60 | 2.68 | 26.76 | 66.9 | nickel and bismuth |
| 19.1 | −43.7 | −0.03 | −0.47 | 65 | 2.97 | 29.71 | 74.26 | nickel and bismuth |
| 19.1 | −43.7 | −0.03 | −0.47 | 70 | 3.28 | 32.76 | 81.9 | nickel and bismuth |
| 19.1 | −43.7 | −0.03 | −0.47 | 75 | 3.59 | 35.93 | 89.81 | nickel and bismuth |
| 19.1 | −43.7 | −0.03 | −0.47 | 80 | 3.92 | 39.2 | 98 | nickel and bismuth |
| 19.1 | −43.7 | −0.03 | −0.47 | 85 | 4.26 | 42.59 | 106.46 | nickel and bismuth |
| 19.1 | −43.7 | −0.03 | −0.47 | 90 | 4.61 | 46.08 | 115.2 | nickel and bismuth |
| 19.1 | −43.7 | −0.03 | −0.47 | 95 | 4.97 | 49.69 | 124.21 | nickel and bismuth |
| 19.1 | −43.7 | −0.03 | −0.47 | 100 | 5.34 | 53.4 | 133.5 | nickel and bismuth |
| 19.1 | −43.7 | −0.03 | −0.47 | 105 | 5.72 | 57.23 | 143.06 | nickel and bismuth |
| 19.1 | −43.7 | −0.03 | −0.47 | 110 | 6.12 | 61.16 | 152.9 | nickel and bismuth |
| 19.1 | −43.7 | −0.03 | −0.47 | 115 | 6.52 | 65.21 | 163.01 | nickel and bismuth |
| 19.1 | −43.7 | −0.03 | −0.47 | 120 | 6.94 | 69.36 | 173.4 | nickel and bismuth |
| 19.1 | −43.7 | −0.03 | −0.47 | 125 | 7.36 | 73.63 | 184.06 | nickel and bismuth |
| 19.1 | −43.7 | −0.03 | −0.47 | 130 | 7.8 | 78 | 195 | nickel and bismuth |
| 19.1 | −43.7 | −0.03 | −0.47 | 135 | 8.25 | 82.49 | 206.21 | nickel and bismuth |
| 19.1 | −43.7 | −0.03 | −0.47 | 140 | 8.71 | 87.08 | 217.7 | nickel and bismuth |
| 19.1 | −43.7 | −0.03 | −0.47 | 145 | 9.18 | 91.79 | 229.46 | nickel and bismuth |
| 19.1 | −43.7 | −0.03 | −0.47 | 150 | 9.66 | 96.6 | 241.5 | nickel and bismuth |

Figure 2:
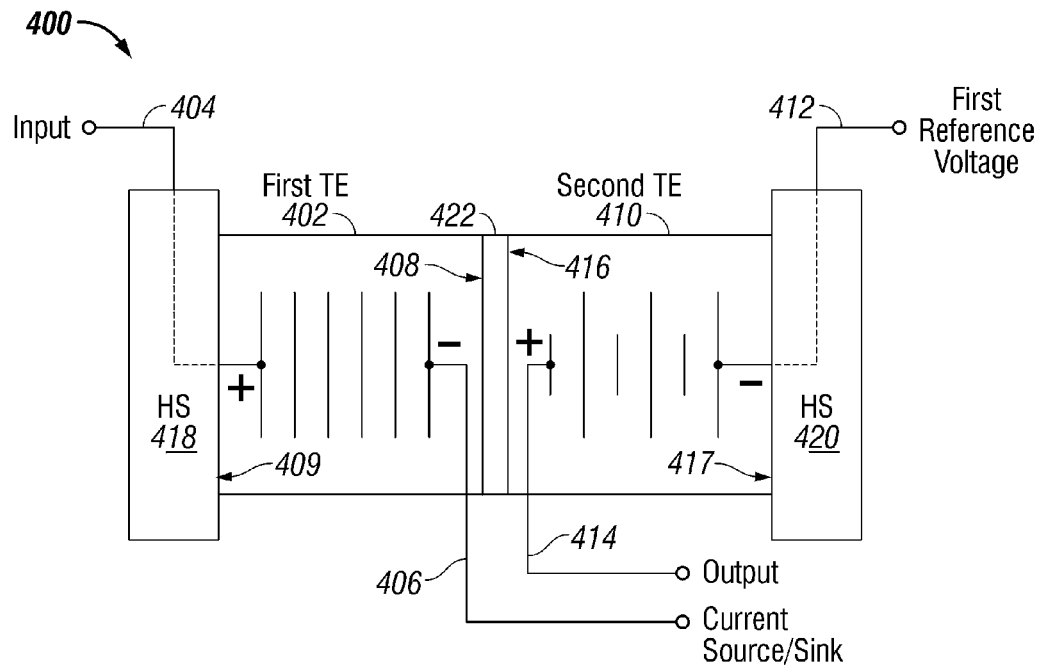
FIG. 2 is a schematic block diagram of a simple thermal electric binary logic circuit.

FIG. 2 is a schematic block diagram of a simple thermal electric binary logic circuit. This design is referred to herein as an example of a dual-TE circuit design. Other examples of dual-TE circuit designs can be found in parent application Ser. No. 12/040,765 (see FIGS. 4-6). The logic circuit 400 comprises a first TE element 402 having a first electrical interface connected on line 404 to accept an input voltage representing an input logic state, and a second electrical interface connected on line 406 to a current source/sink. Typically, the current source/sink is a reference having an intermediate voltage, approximately midway between an input logic high voltage and an input logic low voltage. The use of this intermediate voltage permits the current flow through the first TE 402 to reverse direction when the input voltage is switched from logic high to logic low. The reversal of current through first TE 402 permits thermal interface 408 to become either hot or cold with respect to heatsink 418, which acts as a temperature reference.

The first TE element 402 has a thermal interface 408 to supply a first temperature responsive to the input voltage and a thermal interface 409. A second TE element 410 has a first electrical interface connected on line 412 to a first reference voltage and a second electrical interface connected on line 414 to supply an output voltage responsive to the first temperature. A thermal interface 416 is thermally connected to the first TE element thermal interface 408. A thermally conductive electrical insulator 422 is interposed between the first TE 402 and the second TE 410. A thermal interface 417 is thermally connected to heatsink 420. The first and second TEs may be a thermocouple or a thermopile. More explicitly, the first TE may be referred to as Peltier device due to its use as a temperature generator. The second TE is used as a temperature/voltage generator. When the input voltage is high (logic high), current flows from line 404 to the current sink on line 406, and the thermal interface decreases in temperature. When the input voltage is low (logic low), current flows from the current source on line 406 to the input on line 404, and thermal interface 408 increases in temperature.

In one aspect as shown, a first heatsink 418 is thermally connected to the first TE element thermal interface 409. A second heatsink 420 is thermally connected to the second TE thermal interface 417. In this aspect, heatsinks 418 and 420 are electrically conductive and conduct current to/from the TE electrical interfaces. However, in other aspects not shown, the heatsinks may be electrically insulated from the TE elements 402 and 410. Also as shown, the first TE element second electrical interface connected to line 408 and thermal interface 408 are substantially the same interface. In some aspects, it is assumed for simplicity that thermal and electrical interfaces are a common interface, or that electrical connections are made to the TE through the thermal interfaces. The second TE element second electrical interface connected to line 414 and thermal interface 416 are substantially the same interface, and the second TE element supplies a logic signal on line 414 inverted from the input logic signal.

Figure 3:
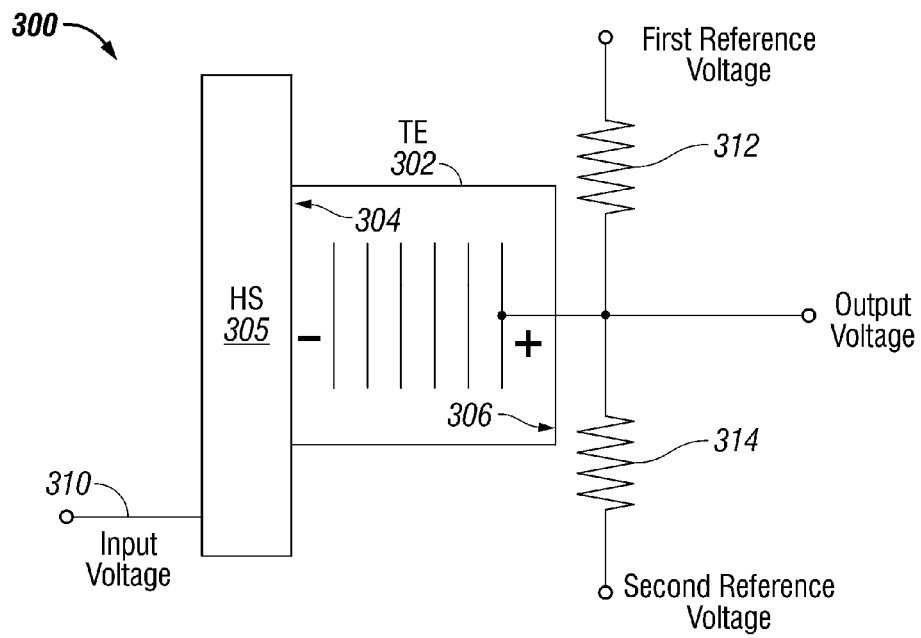
FIG. 3 is a diagram depicting an example of a single TE/thermistor divider circuit with coupled input/output voltages.

FIG. 3 is a diagram depicting an example of a single TE/thermistor divider circuit 300 with coupled input/output voltages. Additional examples of this circuit type can be found in parent application Ser. No. 12/032,549 (see FIG. 4). As shown, the TE element 302 has a first mechanical or thermal interface 304 mounted on a thermally conductive heatsink 305. The heatsink 305 helps maintain the first thermal interface 304 at a constant reference temperature, to help regulate the temperature range at the second thermal interface 306, which in turn helps regulate the output voltage range on line 308. As shown, the TE element first thermal interface 304 is electrically connected to the input voltage on line 310, through the electrically conductive heatsink 305. Assuming the first reference voltage is higher than the second reference voltage, if the first resistive element 312 is a negative coefficient thermistor and the second resistive element 314 is a positive coefficient thermistor, device 300 is a logic inverter.

Alternately but not shown, the TE 302 and heatsink 305 may be separated by an electrical insulator and the input voltage is introduced directly to the first thermal interface 304. The second thermal interface 306 is electrically connected to the first resistive element 312 second end.

Figure 4:
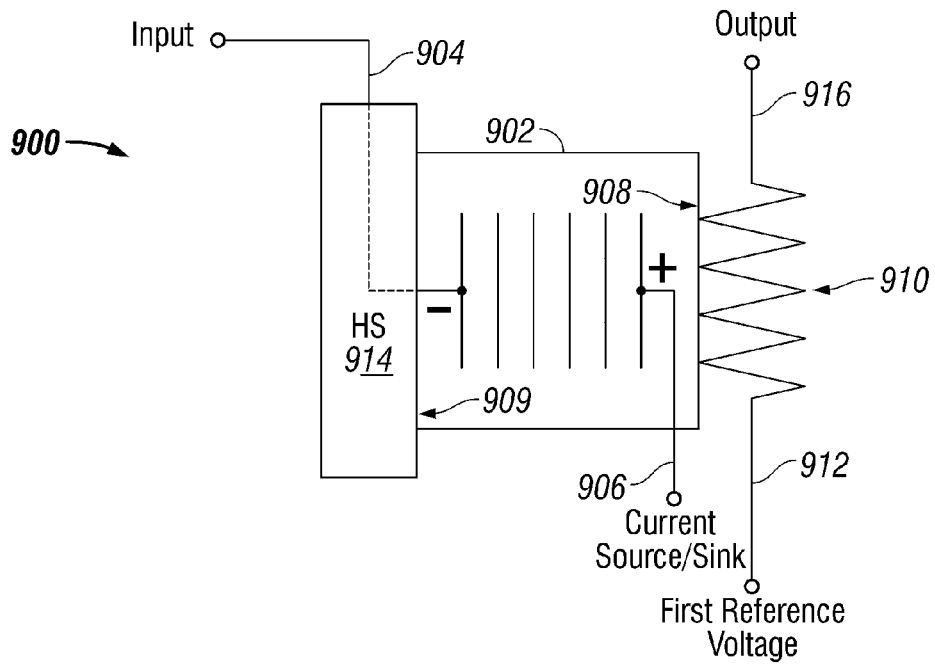
FIG. 4 is a schematic block diagram of a thermal electric binary logic circuit using a thermistor element.

FIG. 4 is a schematic block diagram of a thermal electric binary logic circuit using a thermistor element. This design is referred to herein as a single TE/single thermistor design. Additional examples of the single TE/single thermistor design can be found in parent application Ser. No. 12/040,765 (see FIGS. 9A and 9B). The circuit 900 comprises a TE element 902 having a first electrical interface on line 904 to accept an input voltage representing an input logic state, a second electrical interface connected to a current source/sink on line 906, a thermal interface 908 to supply a first temperature responsive to the input voltage, and a thermal interface 909. A thermistor 910 has a first electrical interface connected to a first reference voltage on line 912, a second electrical interface on line 916 to supply an output voltage responsive to the first temperature, and a thermal interface thermally connected to the first TE element thermal interface 908. The body of the thermistor is its thermal interface. In some aspect not shown, an external pull-up or pull down resistor is connected to the output on line 916 to support current flow across thermistor 910.

The TE element second electrical interface on line 906 and thermal interface 908 are substantially the same interface. In some aspects, it is assumed for simplicity that thermal and electrical interfaces are a common interface, or that electrical connections are made to the TE through the thermal interfaces. The thermistor second electrical interface on line 916 supplies a logic signal inverted from the input logic signal, if thermistor 910 has a positive temperature coefficient. The TE 902 is a thermocouple Peltier device, as explained in detail above. The thermistor 910 may have a positive coefficient, negative coefficient, linear coefficient, non-linear coefficient, or be a combination of the above-mentioned coefficients, depending upon the reference voltage and the desired logic function. An electrically conductive heatsink 914 is thermally connected to thermal interface 909. Alternately but not shown, the HS may be electrically isolated from TE, or the HS may be an electrical insulator.

In one example, the thermistor element 910 has a positive temperature coefficient, the first reference voltage is higher than the second reference voltage, and the resultant device is an inverter.

Figure 5:
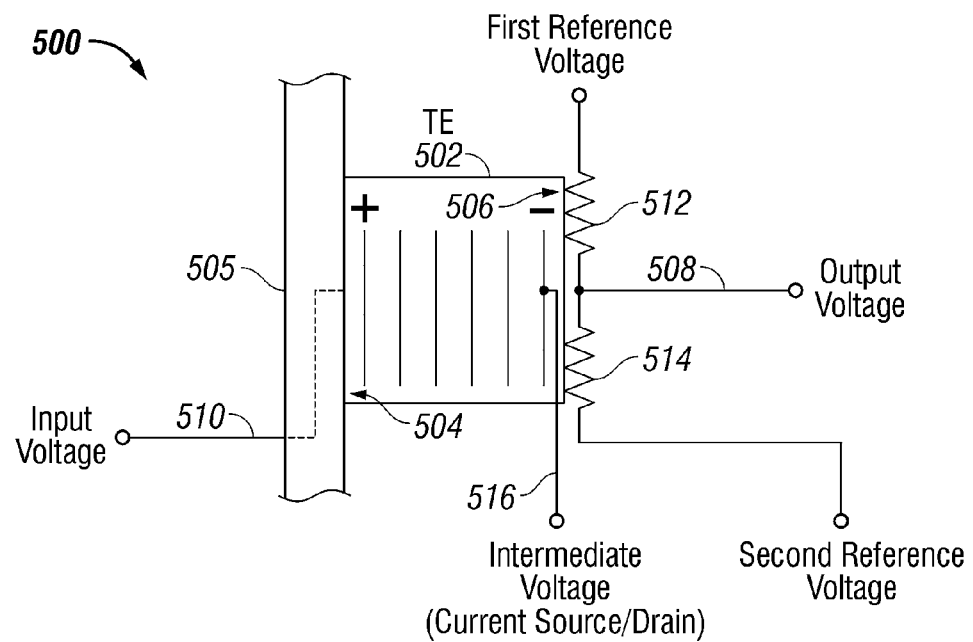
FIG. 5 is a schematic block diagram depicting a single TE/thermistor divider with decoupled input/output voltages.

FIG. 5 is a schematic block diagram depicting a single TE/thermistor divider with decoupled input/output voltages. Additional examples of this circuit type can be found in parent application Ser. No. 12/032,549 (see FIGS. 5A and 5B). The TE 502 is electrically connected to the input voltage 510 through heatsink 505, as in FIG. 3. The TE element 502 is electrically connected to a current source/drain (intermediate voltage reference) on line 516 having an intermediate voltage, approximately midway between an input logic high voltage and an input logic low voltage. In some aspects, it is assumed for simplicity that thermal and electrical interfaces are a common interface, or that electrical connections are made to the TE through the thermal interfaces. In one aspect not shown, the second thermal interface 506 is separated from the resistive elements 512 and 514 by a thermally conductive electrical insulator.

Assuming the first reference voltage is higher than the second reference voltage, if the first resistive element 512 is a positive coefficient thermistor and the second resistive element 514 is a negative coefficient thermistor 514, device 500 is a logic non-inverter (buffer). In response to a high input voltage, interface 506 decreases in temperature, causing the resistance across resistive element 512 to decrease, the resistance across resistive element 514 to increase, and the output voltage to go high. Alternately, if the first resistive element 512 is a negative coefficient thermistor and the second resistive element 514 is a positive coefficient thermistor, device 500 is a logic inverter. A logic high input causes interface 506 to decrease in temperature. As a result, the resistance of thermistor 514 decreases and the resistance of thermistor 512 increases in temperature, so that a logic low output is created. Alternately but not shown, the connection of the input voltage and intermediate voltages may be exchanged.

Figure 6:
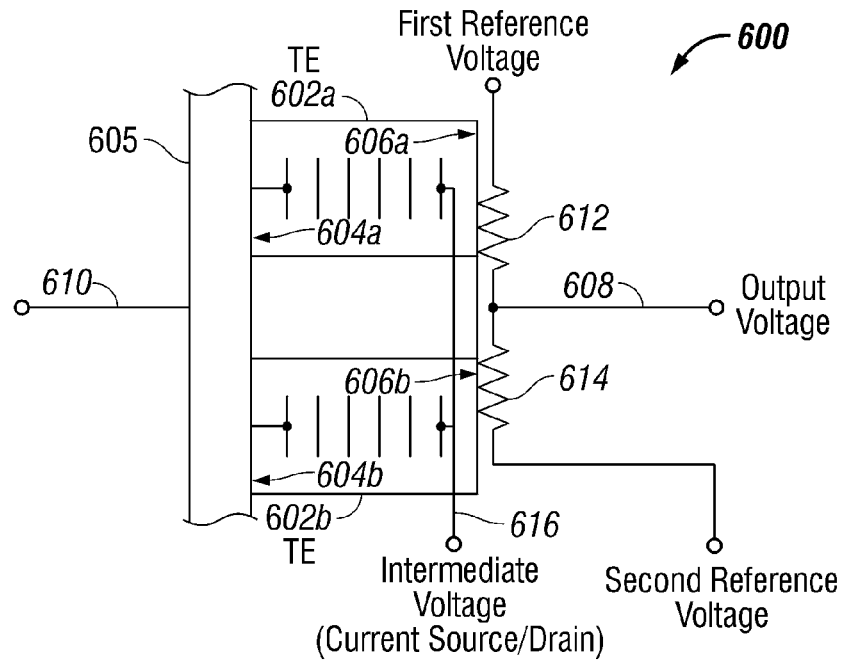
FIG. 6 is a schematic block diagram depicting a TE thermal divider/thermistor divider with decoupled input/output voltages.

FIG. 6 is a schematic block diagram depicting a TE thermal divider/thermistor divider with decoupled input/output voltages. Additional examples of this circuit type can be found in parent application Ser. No. 12/032,549 (see FIGS. 6A and 6B). The TE element circuit 600 includes a first TE element 602a and a second TE element 602b. Each TE element has a first thermal interface 604 to supply a first temperature in response to the input voltage, and a second thermal interface 606 to supply a second temperature in response to the input voltage, different than the first temperature. The input voltage on line 610 is electrically connected to an electrical interface from each TE element, and the other electrical interface of each TE element is electrically connected to a current source/drain on line 616. As shown, the TE element "other" electrical interfaces are substantially the same as thermal interfaces (606a and 606b), and are electrically connected to a current source/drain reference on line 616 having an intermediate voltage, approximately midway between a logic high input voltage and a logic low input voltage. In some aspects, it is assumed for simplicity that thermal and electrical interfaces are a common interface, or that electrical connections are made to the TE through the thermal interfaces.

The first resistive element 612 is adjacent (thermally connected) to the first TE element second thermal interface 606a and the second resistive element 614 is adjacent the second TE element second mechanical interface 606b. Either resistive element may be a thermistor having a positive, negative, linear, or non-linear temperature coefficient. If both resistive elements are thermistors, they can be any combination of the above-mentioned coefficients.

As shown, the TE element first electrical interfaces are electrically connected together through heatsink 605, and the TE element second electrical interfaces are electrically connected together. If the first electrical interfaces (aligned with or proximate to thermal interfaces 604a/604b) are connected to the input voltage, then the second electrical interfaces (aligned with or proximate to thermal interfaces 606a and 606b) are connected to the intermediate voltage current source/sink. If the first electrical interfaces (aligned with thermal interfaces 604a and 604b) are connected to the intermediate voltage current source/drain, then the second electrical interfaces (aligned with thermal interfaces 606a and 606b) are connected to the input voltage on line 610.

Figure 7:
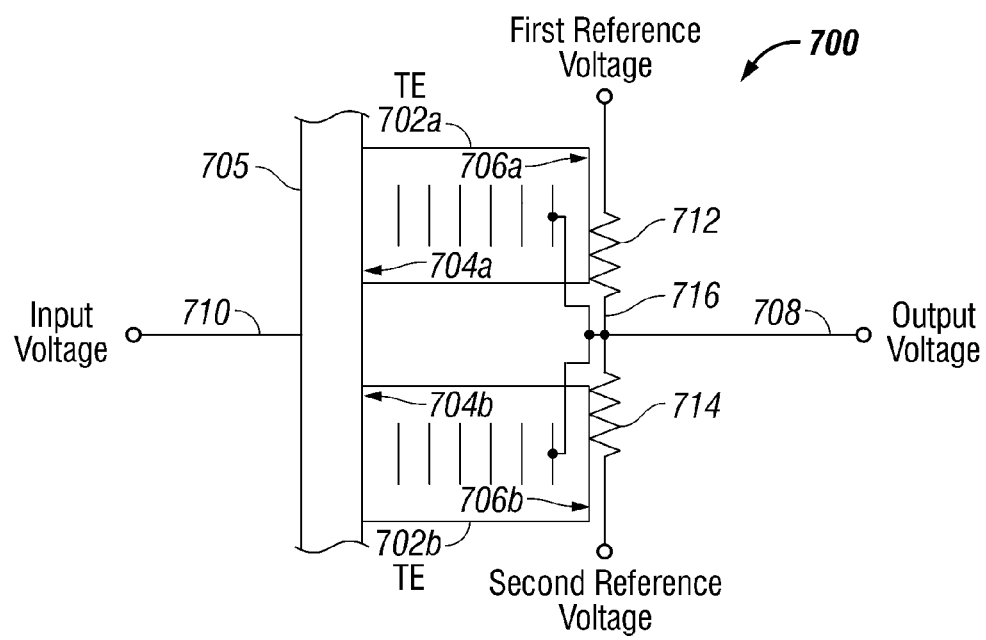
FIG. 7 is a schematic block diagram depicting a TE thermal divider/thermistor divider with coupled input/output voltages.

FIG. 7 is a schematic block diagram depicting a TE thermal divider/thermistor divider with coupled input/output voltages. Additional examples of this circuit type can be found in parent application Ser. No. 12/032,549 (see FIGS. 6C and 6D). One electrical interface from each TE element 702a/702b is connected to the input voltage on line 710 and the TE element other electrical interfaces are electrically connected to the first resistive element 712 second end 716 (line 708). As shown, the TE element first thermal interfaces 704a and 704b are substantially aligned with (proximate to) the first electrical interfaces, and the TE element second electrical interfaces are substantially aligned with thermal interfaces 706a and 706b. In some aspects, it is assumed for simplicity that thermal and electrical interfaces are a common interface, or that electrical connections are made to the TE through the thermal interfaces. Typically, this device is useful as an inverter.

Figure 8:
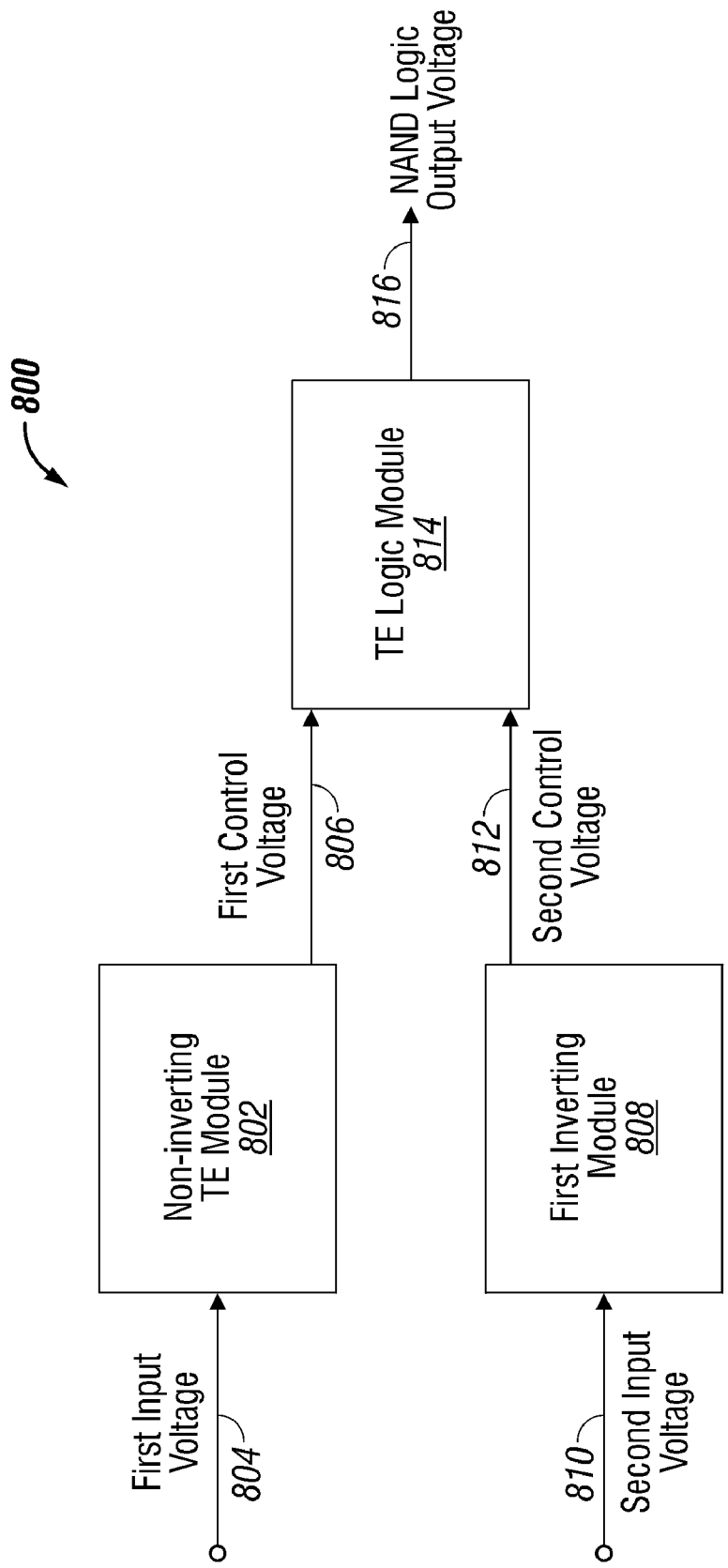
FIG. 8 is a schematic block diagram of a thermal electric binary NAND logic gate circuit.

FIG. 8 is a schematic block diagram of a thermal electric binary NAND logic gate circuit. The NAND gate circuit 800 comprises TE non-inverting module 802 having an input on line 804 to accept a first input voltage and an output on line 806 to supply a first control voltage. A first TE inverter module 808 has an input on line 810 to accept a second input voltage and an output on line 812 to supply a second control voltage. A TE logic module 814 has inputs on lines 806 and 812 to accept the first and second control voltages, and an output on line 816 to supply a NAND logic state output voltage.

Figure 9:
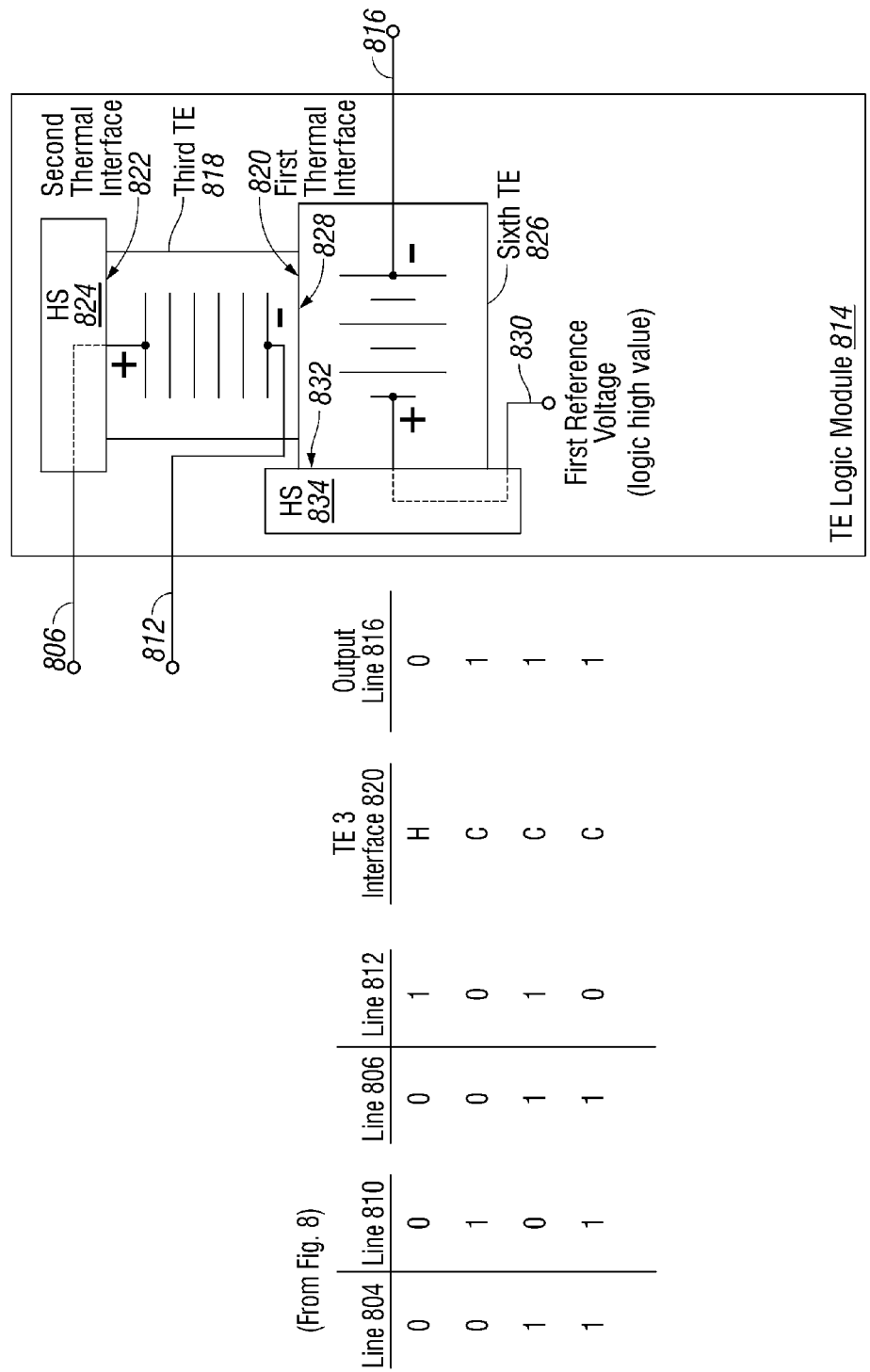
FIG. 9 is a schematic block diagram depicting the TE logic module of FIG. 8 in greater detail.

FIG. 9 is a schematic block diagram depicting the TE logic module of FIG. 8 in greater detail. The TE logic module 814 includes a third TE element 818 having a first electrical interface electrically connected to the first control voltage on line 806 and a second electrical interface electrically connected to the second control voltage on line 812. The third TE element 818 generates a third TE temperature with respect to an output thermal interface 820 in response to the first and second control voltages. Also shown is a reference thermal interface 822. Optionally, the reference thermal interface 822 may be thermally connected to first heatsink 824. As shown, the electrical connection between line 806 and the third TE 818 is made through electrically conductive heatsink 824.

A sixth TE element 826 has an input thermal interface 828 thermally connected to the third TE element output thermal interface 820, and a first electrical interface electrically connected to a first voltage reference through line 830. The sixth TE 826 has a second electrical interface electrically connected to supply the NAND logic state output voltage on line 816 in response to the third TE temperature. The sixth TE 826 has a reference thermal interface 832. As shown, the reference thermal interface 832 is thermally connected to a heatsink 834. In some aspects, heatsinks 824 and 834 are the same, or they are thermally connected.

The third TE element output thermal interface 820 is adjacent the second electrical interface, or is substantially the same interface as the second electrical interface on line 812. The third TE element reference thermal interface 822 is adjacent, or is substantially the same interface as the first electrical interface on line 806.

FIG. 10 is a schematic block diagram depicting the sixth TE of the TE logic module of FIG. 9 in greater detail. In this aspect, the sixth TE element 826 is a polarity TE element, with its negative end connected to the output voltage (line 816 of FIG. 9). A polarity TE element has a first magnitude of output voltage change in a negative direction, at the end marked with the "−" sign, in response to an increase in third TE temperature that heats input thermal interface 828. The first voltage connected to the "+" end of the TE element remains constant. The negative polarity end of the TE element has a lower magnitude of output voltage change in the negative direction, in response to a decrease in third TE temperature.

Typically, a polarity TE element includes a plurality of first thermocouple elements 1000a through 1000n, where n is not limited to any particular number, interposed between a plurality of second thermocouple elements 1002a through 1002n. For example, the first thermocouple elements may be bismuth and the second thermocouple elements may be copper.

As shown, the reference thermal interface is the same as heatsink 834. With reference to FIG. 9, the first reference voltage is about equal to an output logic high value.

Figure 12:
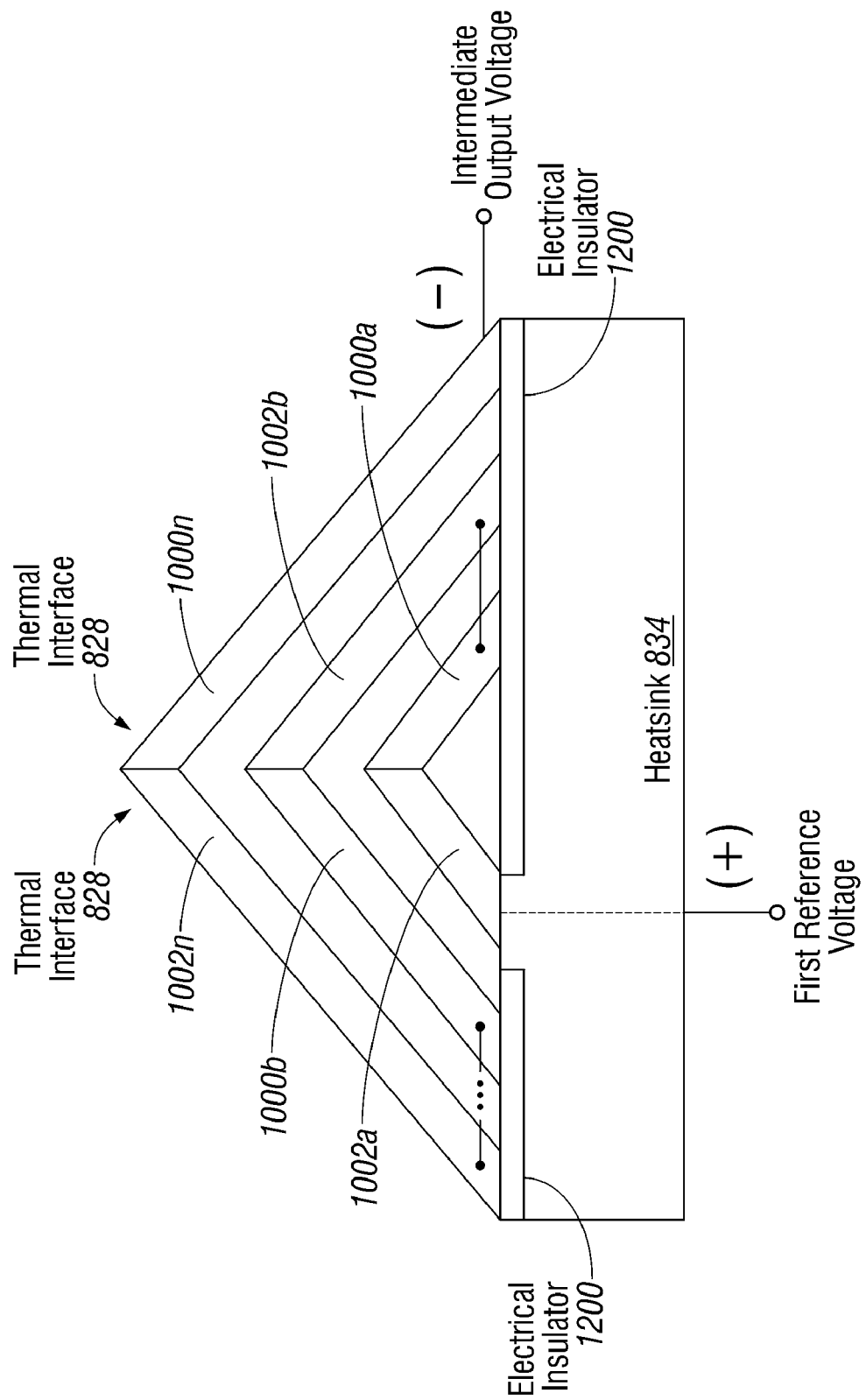
FIG. 12 is a schematic block diagram depicting a variation of the TE of FIG. 10.

FIG. 12 is a schematic block diagram depicting a variation of the TE of FIG. 10. With respect to its negative end, a polarity TE element has a first magnitude of output voltage change in a negative direction, at the end marked with the "−" sign, in response to an increase in third TE temperature that heats input thermal interface 828. The negative polarity end of the TE element has a higher magnitude of output voltage change in the negative direction, in response to an increase in the third TE temperature. Regardless of the direction of polarity, the absolute voltage drop across a thermopile or TE element increases with increased temperature.

As in FIG. 10, the polarity TE element of FIG. 12 includes a plurality of first thermocouple elements 1000a through 1000n, where n is not limited to any particular number, interposed between a plurality of second thermocouple elements 1002a through 1002n. As shown, the reference thermal interface is the same as heatsink 834. In one aspect, as shown, the first thermocouple elements are electrically connected to thermal interface 834 via 1000a. The polarity TE of FIG. 12 can be used in FIG. 9 if its positive end (element 1002a) is connected to the first reference voltage on line 830.

The inverter and non-inverting TE modules of FIG. 8 may be one of the following: a single TE/thermistor divider with coupled input/output voltages (see FIG. 3), a single TE/thermistor divider with decoupled input/output voltages (see FIG. 5), a TE thermal divider/thermistor divider with coupled input/output voltages (see FIG. 7), a TE thermal divider/thermistor divider with decoupled input/output voltages (see FIG. 6), a quad-TE (see FIGS. 1A and 1B), a dual-TE (see FIG. 2), or a single TE/single thermistor (see FIG. 4) circuit. The NAND gate is not limited to just these design however.

Figure 13:
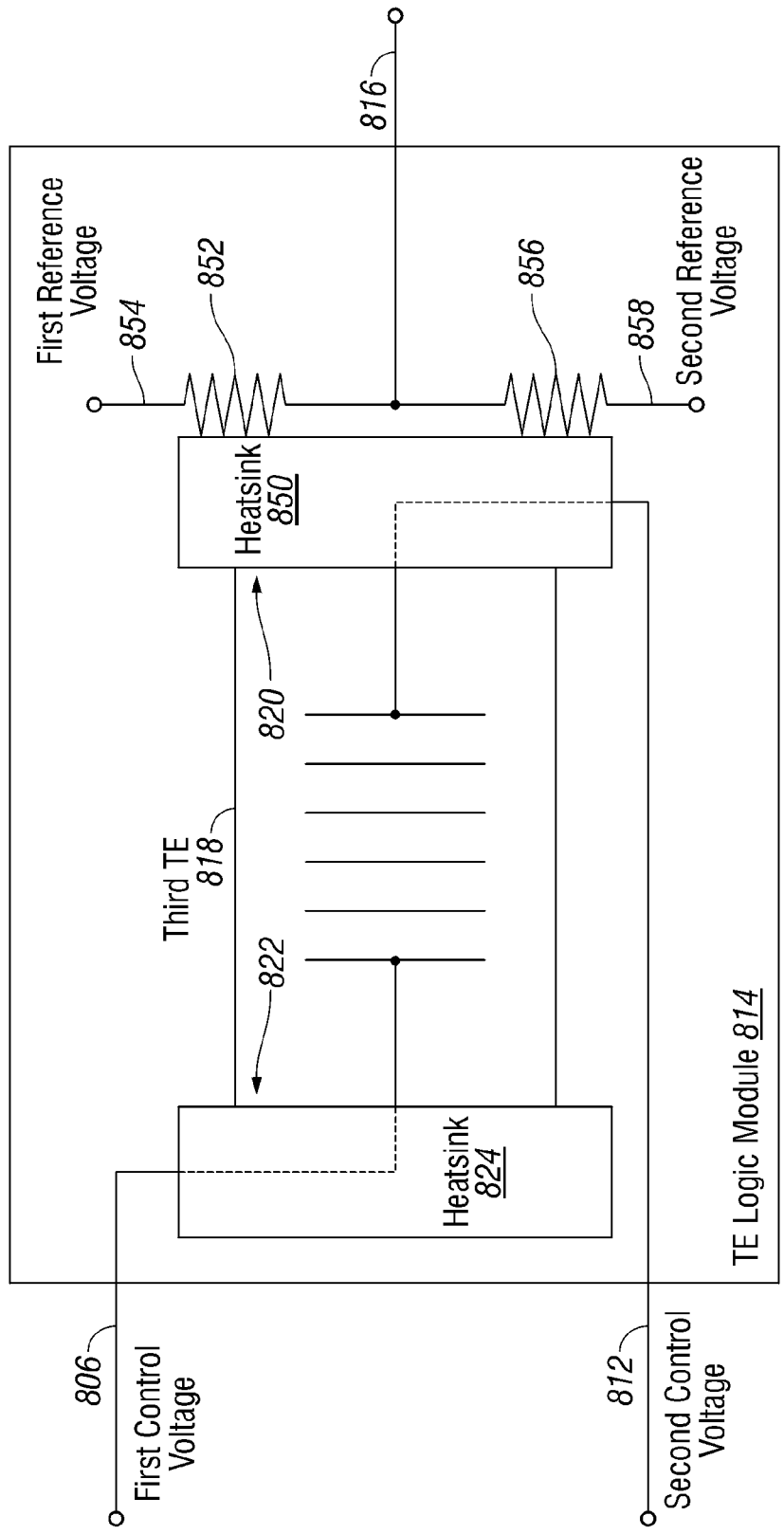
FIG. 13 is a schematic block diagram depicting a third variation of the TE logic module of FIG. 8.

FIG. 13 is a schematic block diagram depicting a third variation of the TE logic module of FIG. 8. The third TE element 818 has a first electrical interface electrically connected to the first control voltage on line 806 and a second electrical interface electrically connected to the second control voltage on line 812. The third TE element 818 generates a third TE temperature with respect to an output thermal interface 820 in response to the first and second control voltages. Also shown is a reference thermal interface 822. Optionally, the reference thermal interface 822 may be thermally connected to first heatsink 824. As shown, the electrical connection between line 806 and the third TE 818 first electrical interface is made through electrically conductive heatsink 824. Also, the electrical connection between line 812 and the third TE second electrical interface is made through heatsink 850.

At least one thermistor 852 is thermally connected to the third TE element. The at least one thermistor 852 is electrically connected to a first reference voltage on line 854, and is electrically connected to supply the output voltage on line 816 in response to the third TE temperature. Although not specifically depicted, a one-thermistor design would be similar to the design of FIG. 4. Explicitly shown is a two resistive divider network with resistive elements 852 and 854. At least one of the resistive elements is a thermistor. Second resistive element 856 is thermally connected to the third TE output thermal interface 820, and electrically connected between line 816 and a second reference voltage on line 858. When thermal interface 820 is heated, the voltage on line 816 can be made to decrease, e.g., if resistive element 852 is a positive coefficient thermistor and resistive element 856 is a negative coefficient thermistor.

Functional Description

Figure 11:
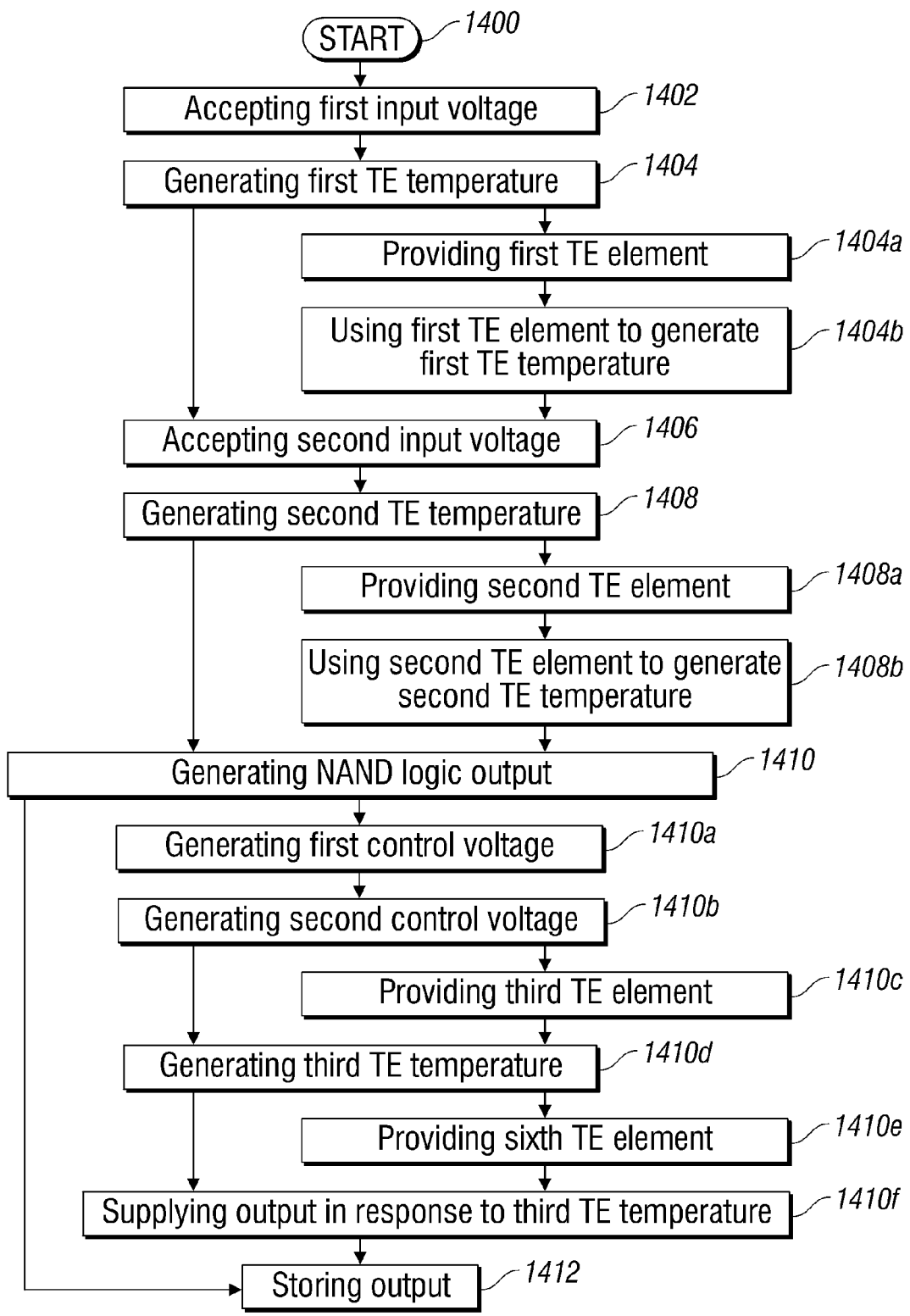
FIG. 11 is a flowchart illustrating a method for thermal electric binary NAND logic gating in a logic device.

FIG. 11 is a flowchart illustrating a method for thermal electric binary NAND logic gating in a logic device. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1400.

Step 1402 accepts a first input voltage representing an input binary logic state. Step 1404 generates a first TE temperature in response to the first input voltage. Step 1406 accepts a second input voltage representing an input binary logic state. Step 1408 generates a second TE temperature in response to the second input voltage. In response to the first and second TE temperatures, Step 1410 generates a NAND logic state output voltage. Step 1412 stores the output voltage in a tangible memory medium.

In one aspect, generating the output voltage in Step 1410 includes substeps. Step 1410*a* generates a first control voltage in response to the first TE temperature. Step 1410*b* generates a second control voltage in response to the second TE temperature. Step 1410*d* generates a third TE temperature in response to the first and second control voltages, Step 1410*f* generates the output voltage in response to the third TE temperature.

In another aspect, generating the first TE temperature in Step 1404 includes substeps. Step 1404*a* provides a first TE element connected to the first input voltage and a current source/sink having an intermediate voltage, approximately midway between an input logic high voltage and an input logic low voltage. In Step 1404*b* the first TE element generates the first TE temperature. Likewise, generating the second TE temperature in Step 1408 includes substeps. Step 1408*a* provides a second TE element connected to the second input voltage and a current source/sink having the intermediate voltage. In Step 1408*b* the second TE element generates the second TE temperature.

In one aspect, generating the first control voltage in Step 1404*a* includes providing a fourth TE thermally connected to the first TE, electrically connected to a first voltage reference, and electrically connected to an output to supply the first control voltage. Then, Step 1404*a* varies the first control voltage across the fourth TE in response to the first TE temperature. Likewise, generating the second control voltage in Step 1404*b* includes providing a fifth TE thermally connected to the second TE, electrically connected to the first voltage reference, and electrically connected to an output to supply the second control voltage. Then, Step 1404*b* varies the second control voltage across the fifth TE in response to the second TE temperature.

In another aspect, generating the output voltage in Step 1410 includes additional substeps. Step 1410*c* provides a third TE electrically connected to the first control voltage and electrically connected to the second control voltage. Then, Step 1410*d* generates the third TE temperature in response to the first and second control voltages. Step 1410*e* provides a sixth TE thermally connected to the third TE, electrically connected to a first reference voltage, and electrically connected to supply the output voltage. Then, Step 1410*f* varies the output voltage across the sixth TE in response to the third TE temperature.

A thermal electric binary NAND logic circuit and method have been provided. Examples of particular schematics and circuit layouts have been given to help explain the invention. However, the invention is not limited to merely these examples. Other variations and embodiments of the invention will occur to those skilled in the art.

I claim:

1. A method for thermal electric binary NAND logic gating in a logic device, the method comprising:
   accepting a first input voltage representing an input binary logic state;
   generating a first thermal electric (TE) temperature in response to the first input voltage;
   accepting a second input voltage representing an input binary logic state;
   generating a second TE temperature in response to the second input voltage;
   in response to the first and second TE temperatures, generating a NAND logic state output voltage; and,
   storing the output voltage in a tangible memory medium.

2. The method of claim 1 wherein generating the output voltage includes:
   generating a first control voltage in response to the first TE temperature;
   generating a second control voltage in response to the second TE temperature;
   generating a third TE temperature in response to the first and second control voltages; and,
   generating the output voltage in response to the third TE temperature.

3. The method of claim 2 wherein generating the first TE temperature includes:
   providing a first TE element connected to the first input voltage and a current source/sink having an intermediate voltage, approximately midway between an input logic high voltage and an input logic low voltage; and,
   the first TE element generating the first TE temperature;
   wherein generating the second TE temperature includes:
   providing a second TE element connected to the second input voltage and a current source/sink having the intermediate voltage; and,
   the second TE element generating the second TE temperature.

4. The method of claim 3 wherein generating the first control voltage includes:
   providing a fourth TE thermally connected to the first TE, electrically connected to a first voltage reference, and electrically connected to an output to supply the first control voltage; and,
   varying the first control voltage across the fourth TE in response to the first TE temperature;
   wherein generating the second control voltage includes:
   providing a fifth TE thermally connected to the second TE, electrically connected to the first voltage reference, and electrically connected to an output to supply the second control voltage; and,
   varying the second control voltage across the fifth TE in response to the second TE temperature.

5. The method of claim 4 wherein generating the output voltage includes:

providing a third TE electrically connected to the first control voltage and electrically connected to the second control voltage;

generating the third TE temperature in response to the first and second control voltages;

providing a sixth TE thermally connected to the third TE, electrically connected to a first reference voltage, and electrically connected to supply the output voltage; and, varying the output voltage across the sixth TE in response to the third TE temperature.

6. A thermal electric binary NAND logic gate circuit comprising:

a thermal electric (TE) non-inverting module having an input to accept a first input voltage and an output to supply a first control voltage;

a first TE inverter module having an input to accept a second input voltage and an output to supply a second control voltage;

a TE logic module having inputs to accept the first and second control voltages and an output to supply a NAND logic state output voltage.

7. The circuit of claim 6 wherein the TE logic module includes:

a third TE element having a first electrical interface electrically connected to the first control voltage, a second electrical interface electrically connected to the second control voltage, and an output thermal interface to supply a third TE temperature in response to the first and second control voltages; and, a sixth TE element having an input thermal interface thermally connected to the third TE element output thermal interface, a first electrical interface electrically connected to a first voltage reference, and a second electrical interface electrically connected to supply the NAND logic state output voltage in response to the third TE temperature.

8. The circuit of claim 7 wherein the third TE element output thermal interface is adjacent the second electrical interface, and wherein the third TE element has a reference thermal interface adjacent the first electrical interface; and, wherein the sixth TE element is a polarity TE element.

9. The circuit of claim 8 wherein the first reference voltage is about equal to an output logic high value.

10. The circuit of claim 6 wherein the TE logic module includes:

a third TE element having a first electrical interface electrically connected to the first control voltage, a second electrical interface electrically connected to the second control voltage, and an output thermal interface to supply a third TE temperature in response to the first and second control voltages;

a sixth TE element having an input thermal interface thermally connected to the third TE element output thermal interface, a first electrical interface electrically connected to a first voltage reference, and a second electrical interface electrically connected to supply an intermediate output voltage in response to the third TE temperature; and, a second TE inverter module having an input to accept the intermediate output voltage and an output to supply the NAND logic state output voltage.

11. The circuit of claim 10 wherein the third TE element output thermal interface is adjacent the second electrical interface, and wherein the third TE element has a reference thermal interface adjacent the first electrical interface; and, wherein the sixth TE element is a polarity TE element.

12. The circuit of claim 11 wherein the first reference voltage is about equal to an output logic low value.

13. The circuit of claim 6 wherein the TE non-inverter module and TE inverter modules are each selected from a group consisting of a single TE/thermistor divider with coupled input/output voltages, a single TE/thermistor divider with decoupled input/output voltages a TE thermal divider/thermistor divider with coupled input/output voltages, a TE thermal divider/thermistor divider with decoupled input/output voltages, a quad-TE, a dual-TE, and a single TE/single thermistor circuit.

14. The circuit of claim 6 wherein the TE logic module includes:

a third TE element electrically connected to the first control voltage and electrically connected to the second control voltage, and generating a third TE temperature in response to the first and second voltages;

a thermistor thermally connected to the third TE element, electrically connected to a first reference voltage, and electrically connected to supply the output voltage in response to the third TE temperature.

15. The circuit of claim 7 wherein the sixth TE element has a temperature-to-voltage conversion polarity, the sixth TE element including a plurality of first thermocouple elements interposed between a plurality of second thermocouple elements, the sixth TE element having a first magnitude of output voltage change in a first direction, in response to an increase in third TE temperature, and a second magnitude of output voltage change in a second direction, different from the first magnitude, in response to a decrease in third TE temperature.

* * * * *